United States Patent [19]
Lu

[11] Patent Number: 5,679,596
[45] Date of Patent: Oct. 21, 1997

[54] SPOT DEPOSITED POLYSILICON FOR THE FABRICATION OF HIGH CAPACITANCE, DRAM DEVICES

[75] Inventor: Chih-Yuan Lu, Hsinchu, Taiwan

[73] Assignee: Vanguard International Semiconductor Corporation, Hsin-Chu, Taiwan

[21] Appl. No.: 734,061

[22] Filed: Oct. 18, 1996

[51] Int. Cl.$^6$ ............................................. H01L 21/8242
[52] U.S. Cl. ........................... 437/52; 437/60; 437/919
[58] Field of Search .............................. 437/47, 52, 60, 437/919

[56] References Cited

U.S. PATENT DOCUMENTS

| 5,134,086 | 7/1992 | Ahn | 437/52 |
|---|---|---|---|
| 5,213,992 | 5/1993 | Lu | 437/52 |
| 5,278,091 | 1/1994 | Fazan et al. | 437/52 |
| 5,302,540 | 4/1994 | Ko et al. | 437/52 |
| 5,340,763 | 8/1994 | Dennison | 437/52 |
| 5,350,707 | 9/1994 | Ko et al. | 437/52 |
| 5,407,534 | 4/1995 | Thakur | 156/662 |
| 5,447,878 | 9/1995 | Park et al. | 437/52 |
| 5,492,848 | 2/1996 | Lur et al. | 437/52 |
| 5,521,408 | 5/1996 | Rha et al. | 257/309 |

OTHER PUBLICATIONS

YK Jun. "The Fabrication and Electrical Properties of Modulated Stacked Capacitor for Advanced DRAM Applications" IEEE Electronic Device Letters, vol. 13, No. 8, Aug. 1992. pp. 430–432.

*Primary Examiner*—Jey Tsai
*Attorney, Agent, or Firm*—George O. Saile

[57] ABSTRACT

A method of increasing the surface area of a STC structure, used for high density, DRAM devices, has been developed. The process consists of creating multiple, narrow crevices in a polysilicon, bottom electrode structure. This is accomplished by initially depositing a discontinuous layer of spot polysilicon on a thin silicon oxide layer, with the thin silicon oxide layer overlying the polysilicon bottom electrode. The spot polysilicon feature is transferred to the underlying thin silicon oxide layer, via conventional etching procedures, creating multiple, narrow, structures of spot polysilicon overlying the thin silicon oxide. These structures are then used as a micro-mask to create multiple, narrow crevices, via etching of the underlying polysilicon bottom electrode. Removal of the micro-mask, formation of a thin dielectric layer, and creation of a polysilicon upper electrode, complete the STC fabrication sequence.

25 Claims, 5 Drawing Sheets

SPOT DEPOSITED POLYSILICON FOR THE FABRICATION OF HIGH CAPACITANCE, DRAM DEVICES

BACKGROUND OF THE INVENTION (1) Field of the Invention

The present invention relates to methods used for fabrication of high density, semiconductor memory cells, and more specifically to a process used to create a stacked capacitor, DRAM structure, with increased capacitance resulting from an increased surface capacitor surface area.

(2) Description of the Prior Art

The objectives of the semiconductor industry are to continually improve device performance, while still attempting to decrease the manufacturing cost of specific semiconductor chips. These objectives have been in part realized by the ability of the semiconductor industry to produce chips with sub-micron features, or micro-miniaturization. Smaller features allow the reduction in performance degrading capacitances and resistances to be realized. In addition smaller features result in a smaller chip, however possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the drain of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 64 million cells per chip, or greater, has resulted in a specific cell in which a smaller transfer gate transistor is being used, and thus limiting the amount of area the overlying STC structure can occupy, without interfering with neighboring cells.

Solutions to the shrinking design area, assigned to STC structures, have been addressed via novel semiconductor fabrication processes which result in an increase in surface area for only the bottom, or storage electrode, of the STC structure, while maintaining the area original design area of the STC structure. One method for achieving this objective been accomplished by creating bottom electrodes with pillars, or protruding fingers of polysilicon, thus resulting in a greater electrode surface area then would have been achieved with conventional flat surfaces. Ahn, in U.S. Pat. No. 5,134,086, as well as Lur, et al, in U.S. Pat. No. 5,492,848, have described processes in which pillars of polysilicon are formed in a bottom electrode of a STC structure. Ahn describes a process in which the pillars are formed using an insulator mask, formed by subjecting a thin overlying polysilicon layer to a hydrofluoric acid treatment, allowing the acid to pass through the grain boundaries of the thin polysilicon layer, attacking and patterning the underlying insulator layer, and then using the patterned insulator layer as a mask to create the pillar structure of the bottom, polysilicon electrode. Lur, et al, use a similar procedure, however using silicon nodules, obtained via deposition of a metal-silicon alloy, followed by annealing, and then using the silicon nodules as a mask to pattern underlying insulator, and subsequently the bottom electrode of the STC structure.

This invention will feature the use of silicon islands, or spot deposited polysilicon, used as a mask to subsequently produce a bottom electrode comprised of polysilicon pillars, and crevices in the polysilicon. This process features the use of spot deposited polysilicon, obtained via deposition of thin, discontinuous layers of polysilicon, on an insulator layer, which in turn overlying the polysilicon layer used for the bottom electrode. The complexity of grain boundary definition, used by Ahn, or the complexity of using a metal alloy, and heat treating, as presented by Lur, et al, is reduced using the simpler, thin polysilicon deposition process, presented in this invention. The thin deposition results in a discontinuous polysilicon layer, thus the creation of isolated silicon islands, created without wet etching or metallization procedures. This process can be used for dense DRAM arrays, in which a limited area is presented for cells, and the spaces between cells.

SUMMARY OF THE INVENTION

It is an object of this invention to create a high density, semiconductor memory chip, comprised of DRAM cells, using STC structures, in which the surface area, of the bottom electrode of the STC structure, is increased, without increasing the width of the STC structure.

It is another object to create a bottom electrode, of an STC structure, comprised of polysilicon pillars, and crevices in a polysilicon bottom electrode, in which the pillars and crevices are obtained without the use of photolithographic masking and processing.

It is yet another object of this invention to use spot deposited polysilicon as a mask, to create a bottom electrode, of a STC structure, comprised of multiple, narrow polysilicon pillars or protrusions, and crevices.

In accordance with the present invention a method for producing increased capacitance DRAM cells, via use of an STC structure, comprised of a bottom electrode with multiple, narrow polysilicon pillars and crevices, has been developed. A transfer gate transistor, comprised of: a thin gate insulator; a polysilicon gate structure; lightly doped source and drain regions; insulator spacers on the sidewalls of the polysilicon gate structure; and the option of using a heavily doped source and drain regions, is formed on a semiconductor substrate. An insulator layer is deposited and an opening to the drain region of the transfer gate transistor is formed. A layer of polysilicon is deposited and patterned to create the desired shape of the bottom electrode, of a STC structure. A thin layer of silicon oxide is grown on the bottom electrode shape, followed by the deposition of a thin, discontinuous layer, of spot polysilicon. A wet etchant, or an isotropic dry plasma etch, selectively removes silicon oxide from between the islands of spot polysilicon, creating multiple features of spot polysilicon islands, overlying silicon oxide islands, exposing the polysilicon bottom electrode in the spaces between multiple features of spot polysilicon on silicon oxide islands. These multiple features are then used as micro-masks to allow a dry etch procedure to be performed, this time selective to removing polysilicon at a greater rate then insulator, creating crevices in the spaces between micro-mask features, while leaving polysilicon pillars in regions covered by the micro-masking features. The spot polysilicon is also removed during the creation of the crevices, leaving only the silicon oxide, micro-masking shapes on the underlying bottom electrode. After removal of the silicon oxide micro-masking shapes a capacitor dielectric layer is grown on the bottom electrode, now possessing increased surface area as a result of the crevices in the polysilicon bottom electrode. Another layer of polysilicon is then deposited and patterned to create the upper electrode, of the STC structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM cell, with increased capacitance resulting from the use of a STC structure that features a bottom electrode, comprised of multiple, narrow polysilicon pillars and crevices, will now be described. The transfer gate transistor, used for this DRAM cell, in this invention, will be an N channel device. However the STC structure, with the increased surface area described in this invention, can also be applied to P channel, transfer gate transistor.

Figure 1:
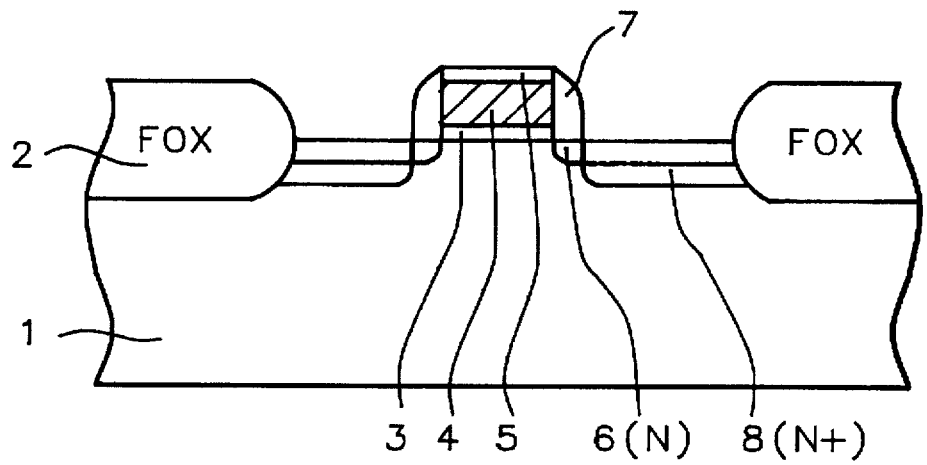
FIGS. 1–8, which schematically shows, in cross-sectional style, the key fabrication stages used in the creation of a DRAM cell, with a STC structure, with an increased surface area of a bottom electrode of the STC, obtained via a spot polysilicon deposition and etching procedure.

Referring to FIG. 1, a P type, semiconductor substrate, 1, with a <100>, single crystalline orientation, is used. Field oxide, (FOX), regions, 2, are used for purposes of isolation. Briefly the FOX regions, 2, are formed via thermal oxidation, in an oxygen-steam ambient, at a temperature between about 850° to 1050° C., to a thickness between about 3000 to 5000 Angstroms. A patterned oxidation resistant mask of silicon nitride-silicon oxide is used to prevent FOX regions, 2, from growing on areas of substrate, 1, to be used for subsequent device regions. After the growth of the FOX regions, 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer, 3, of silicon oxide is thermally grown in an oxygen-steam ambient, at a temperature between about 850° to 1050° C., to a thickness between about 50 to 200 Angstroms. A polysilicon layer is next deposited using low pressure chemical vapor deposition, (LPCVD), procedures, at a temperature between about 500° to 700° C., to a thickness between about 1500 to 4000 Angstroms. The polysilicon can either be grown intrinsically and doped via ion implantation of arsenic or phosphorous, at an energy between about 30 to 80 KeV, at a dose between about 1E13 to 1E16 atoms/cm$^2$, or grown using in situ doping procedures, via the incorporation of either arsine or phosphine to the silane ambient. A layer of silicon oxide is next deposited, using LPCVD or plasma enhanced chemical vapor deposition, (LPCVD), procedures, at a temperature between about 400° to 700° C., to a thickness between about 500 to 1500 Angstroms. Conventional photolithographic and reactive ion etching, (RIE), procedures, using CHF$_3$ as an etchant for silicon oxide, and Cl$_2$ as an etchant, are used to pattern the silicon oxide and polysilicon layers, creating pad oxide layer, 5, overlying polysilicon gate structure, 4, shown schematically in FIG. 1. Photoresist removal is accomplished via plasma oxygen ashing and careful wet cleans.

A lightly doped source and drain region, 6, is next formed via ion implantation of phosphorous, at an energy between about 10 to 60 KeV, at a dose between about 1E12 to 5E13 atoms/cm$^2$. Another silicon oxide layer is then deposited using either LPCVD or PECVD procedures, at a temperature between about 400° to 700° C., to a thickness between about 1500 to 4000 Angstroms, followed by an anisotropic RIE procedure, using CHF$_3$ as an etchant, creating insulator spacer, 7, on the sidewalls of polysilicon gate structure, 4. An option of using a heavily doped source and drain region, 8, can then be used, if desired, by formation of this region via ion implantation of arsenic, at an energy between about 10 to 80 KeV, at a dose between about 5E14 to 1E16 atoms/cm$^2$. The heavily doped source and drain region, 8, if used to lower contact resistance, can add junction leakage, and thus is included as an option only if the need for lower contact resistance is paramount. The result of these procedures are schematically shown in FIG. 1.

Figure 2:
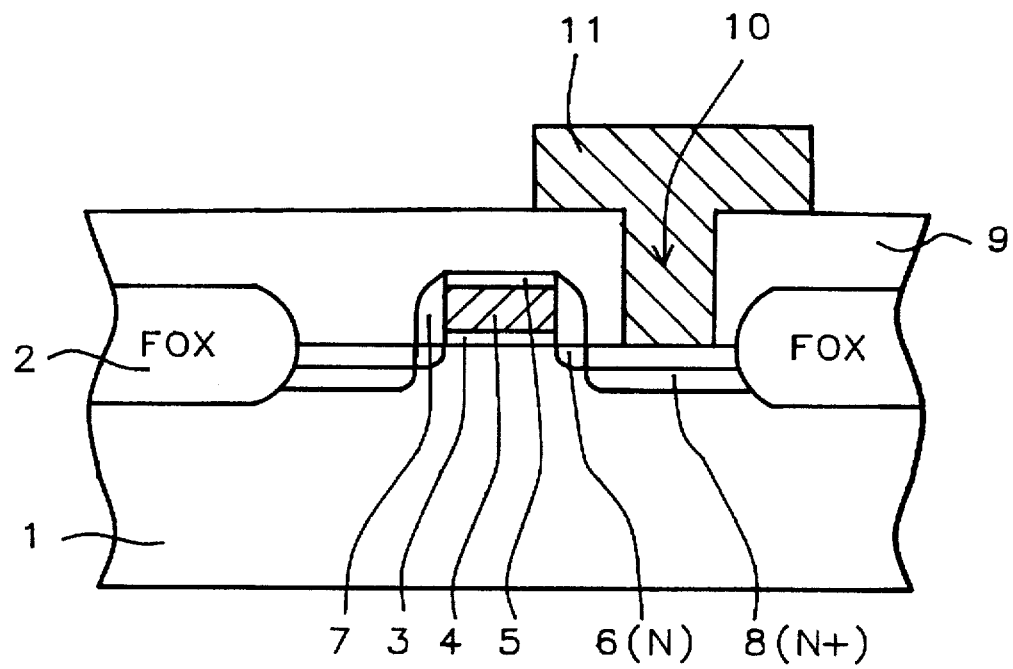
Figure 3:
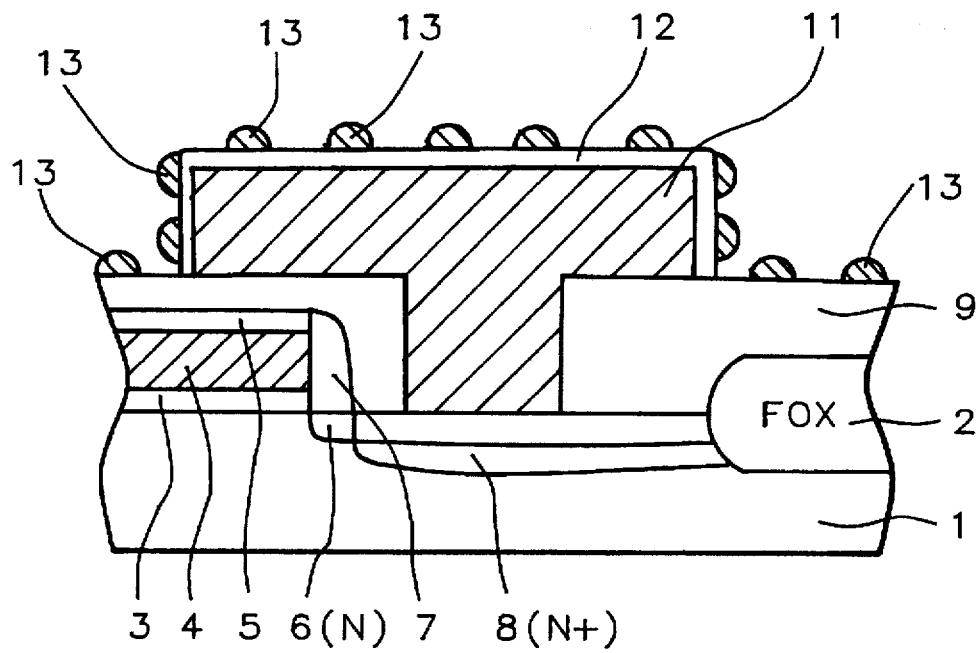

A layer of silicon oxide, 9, is next deposited using LPCVD or PECVD procedures, at a temperature between about 400° to 700° C., to a thickness between about 3000 to 8000 Angstroms. Conventional photolithographic and RIE procedures, using CHF$_3$ as an etchant, are used to open contact hole, 10, in silicon oxide layer, 9, exposing the top surface of heavily doped source and drain region, 8, or lightly doped source and drain region, 6, if the heavily doped source and drain option is not used. Photoresist removal is performed via use of plasma oxygen ashing and careful wet cleans. Another polysilicon layer is then grown via LPCVD procedures, at a temperature between about 500° to 700° C., to a thickness between about 3000 to 7000 Angstroms. The polysilicon layer can either be grown intrinsically, and doped via ion implantation of either arsenic or phosphorous, or grown using in situ doping procedures, by the addition of either arsine or phosphine to a silane ambient. Photolithographic and RIE procedures, using Cl$_2$ as an etchant, are again used to create a polysilicon bottom electrode or storage node, 11, having a width between about 2000 to 10000 Angstroms, shown schematically in FIG. 2. Photoresist removal is once again accomplished using plasma oxygen ashing and careful wet cleans. Although not shown in the drawings, the increased densities of DRAM memory cells, can require that the spaces between bottom electrode structures of a specific cell, or of adjacent cells, to be separated by only between about 1000 to 5000 Angstroms.

FIGS. 3–6, will now describe the creation of a bottom electrode, of an STC structure, in which the surface area of the bottom electrode has been increased due to creation of polysilicon pillars, and crevices. First a thin, silicon oxide layer, 12, is grown on the exposed surface of polysilicon bottom electrode, 11, via thermal oxidation in an oxygen ambient, at a temperature between about 650° to 950° C., to a thickness between about 100 to 300 Angstroms. Thin, silicon oxide layer, 12, can also be obtained via LPCVD procedures. Next a critical deposition of polysilicon is performed, via LPCVD procedures, at a temperature between about 500° to 750° C., to a thickness between about 100 to 300 Angstroms. At these conditions, and for the length of time needed to grow only 100 to 300 Angstroms of polysilicon, the polysilicon layer is discontinuous, resulting in a deposition of mounds of spot polysilicon, 13, shown schematically in FIG. 3. The diameter of a spot polysilicon, 13, mound is between about 50 to 500 Angstroms, with the spaces between the mounds of spot polysilicon, between about 100 to 1000 Angstroms.

Figure 4:
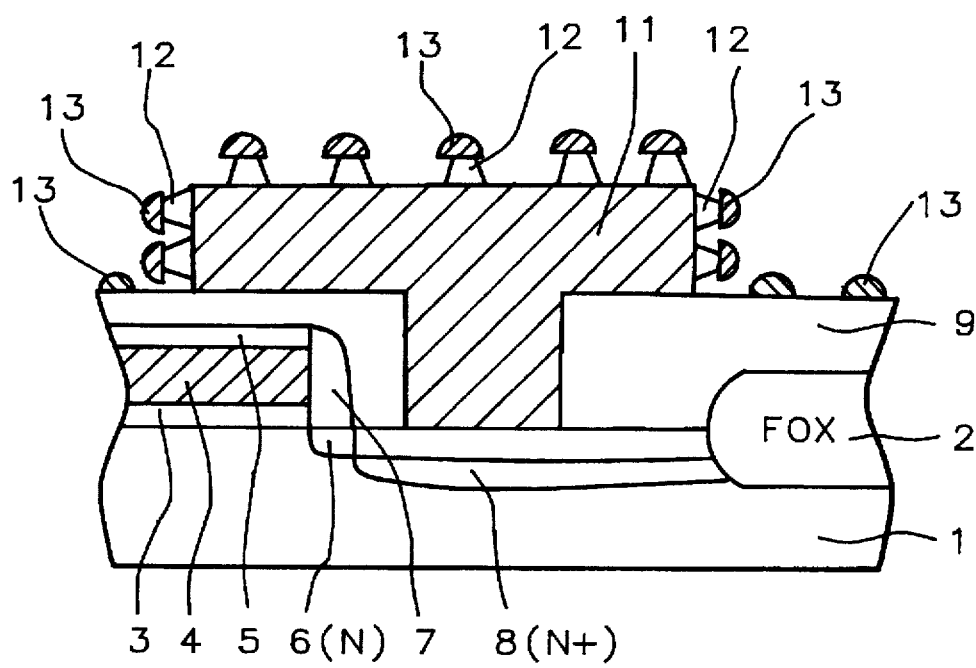
Figure 5:
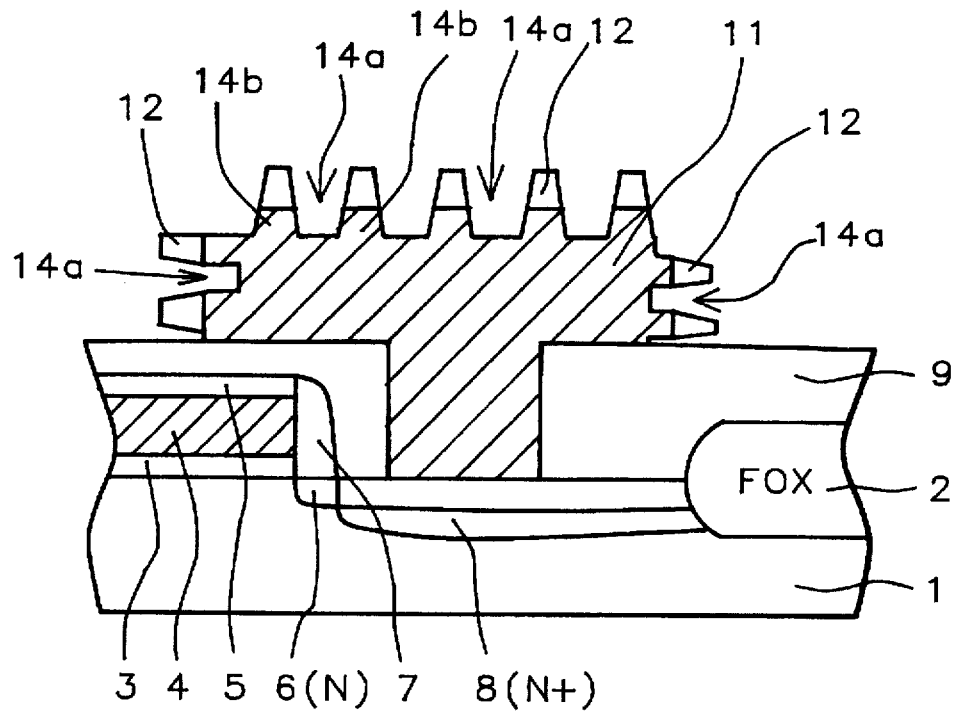
Figure 6:
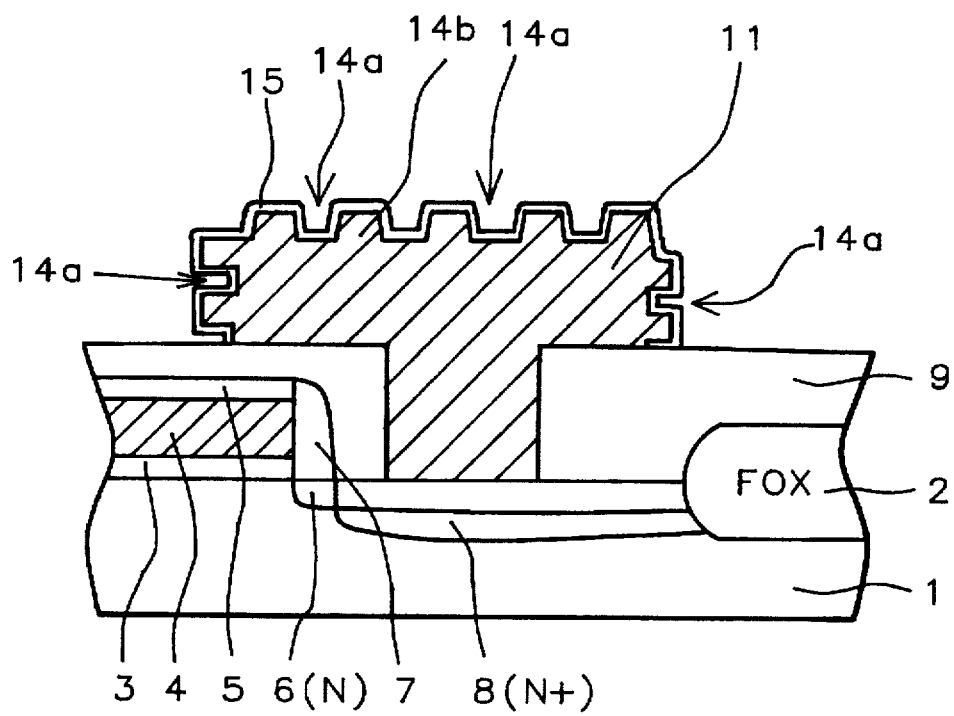

FIG. 4, shows the result of using mounds of spot polysilicon, 13, as a mask for patterning underlying silicon oxide layer, 12, and forming silicon oxide mounds, 12, underlying polysilicon mounds, 13. This is accomplished via use of a dilute hydrofluoric acid solution, using 1 part hydrofluoric acid to between about 10 to 200 parts water. This result can also be obtained using an isotropic dry etch. The multiple, narrow mounds of spot polysilicon, 13, —silicon oxide, 12, are next used as a micro-mask to create the desired multiple narrow crevices, 14a, as well as the polysilicon pillars, 14b, in polysilicon bottom electrode, 11. This is accomplished using a dry, isotropic etch, using $Cl_2$ as the etchant. This etching chemistry, removing polysilicon at a rate between about 40 to 100 times faster then oxide, results in multiple, narrow pillars of polysilicon, 14b, identical in width to the width of the spot polysilicon mound, and with crevices, 14a, between the polysilicon pillars, 14b, at a width, similar to the width of the spaces between the mounds of spot polysilicon. The depth of the crevices, 14a, in polysilicon bottom electrode, 11, is between about 500 to 5000 Angstroms. The creation of polysilicon pillars, 14b, and crevices, 14a, result in an increase in the surface area of polysilicon bottom electrode, 11, of between about 50 to 250%, when compared to the surface area of bottom electrodes, obtained via the use of smooth polysilicon surfaces. This etch procedure for creating polysilicon pillars and crevices also results in the removal of spot polysilicon mound, 13. The result of these steps is schematically shown in FIG. 5. Another option for etching crevices in the bottom electrode, 11, is via use of a wet silicon etch, such as KOH. The resulting crevice formation, using wet KOH is identical to the crevice formation obtained via use of the isotropic dry etch.

Figure 7:
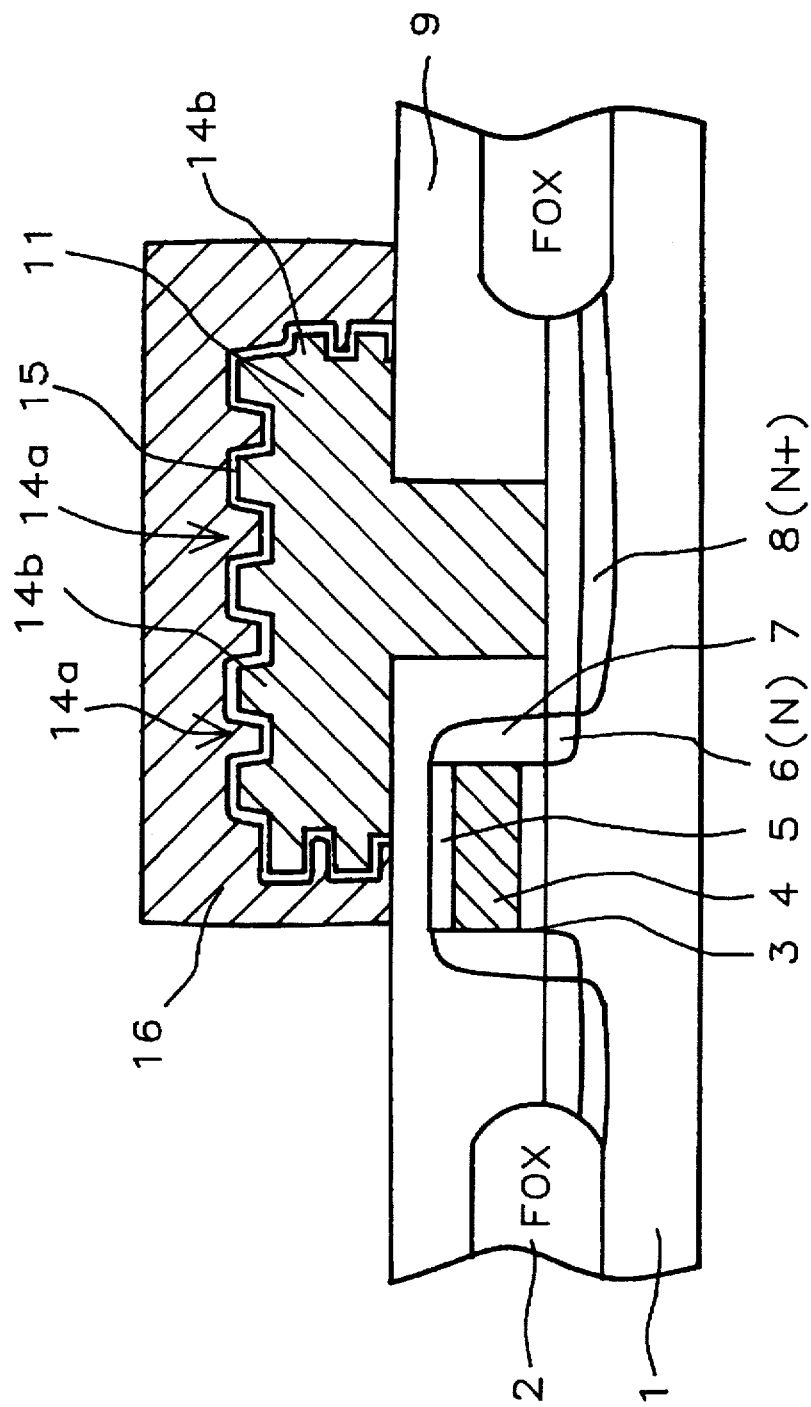

Next the mounds of silicon oxide, 12, are removed via wet etching procedures, followed by the creation of dielectric layer, 15, overlying polysilicon bottom electrode, 11. Dielectric layer, 15, can be an insulator layer possessing a high dielectric constant, such as $Ta_2O_5$, obtained via r.f sputtering, or chemical vapor deposition, (CVD), techniques, at an effective silicon oxide thickness between about 10 to 60 Angstroms. Dielectric layer, 15, can also be ONO, (Oxidized—silicon Nitride—silicon Oxide). The ONO layer is formed by initially growing a silicon dioxide layer, between about 10 to 50 Angstroms, followed by the deposition of a silicon nitride layer, between about 10 to 20 Angstroms. Subsequent thermal oxidation of the silicon nitride layer results in the formation of a silicon oxynitride layer on silicon oxide, at a silicon oxide equivalent thickness of between about 40 to 80 Angstroms. This is schematically displayed in FIG. 6. Finally another layer of polysilicon is deposited, via LPCVD procedures, at a temperature between about 500° to 700° C., to a thickness between about 1000 to 5000 Angstroms. Doping of this polysilicon layer is again accomplished via use of either in situ doping procedures, or via deposition of an intrinsic layer, followed by either phosphorous or arsenic ion implantation procedures. Photolithographic and RIE procedures, using $Cl_2$ as an etchant, are next employed to create polysilicon upper electrode, or plate electrode, 16, shown schematically in FIG. 7. Photoresist is again removed via plasma oxygen ashing and careful wet cleans. The width of plate electrode, 16, is between about 3000 to 15000 Angstroms.

Figure 8:
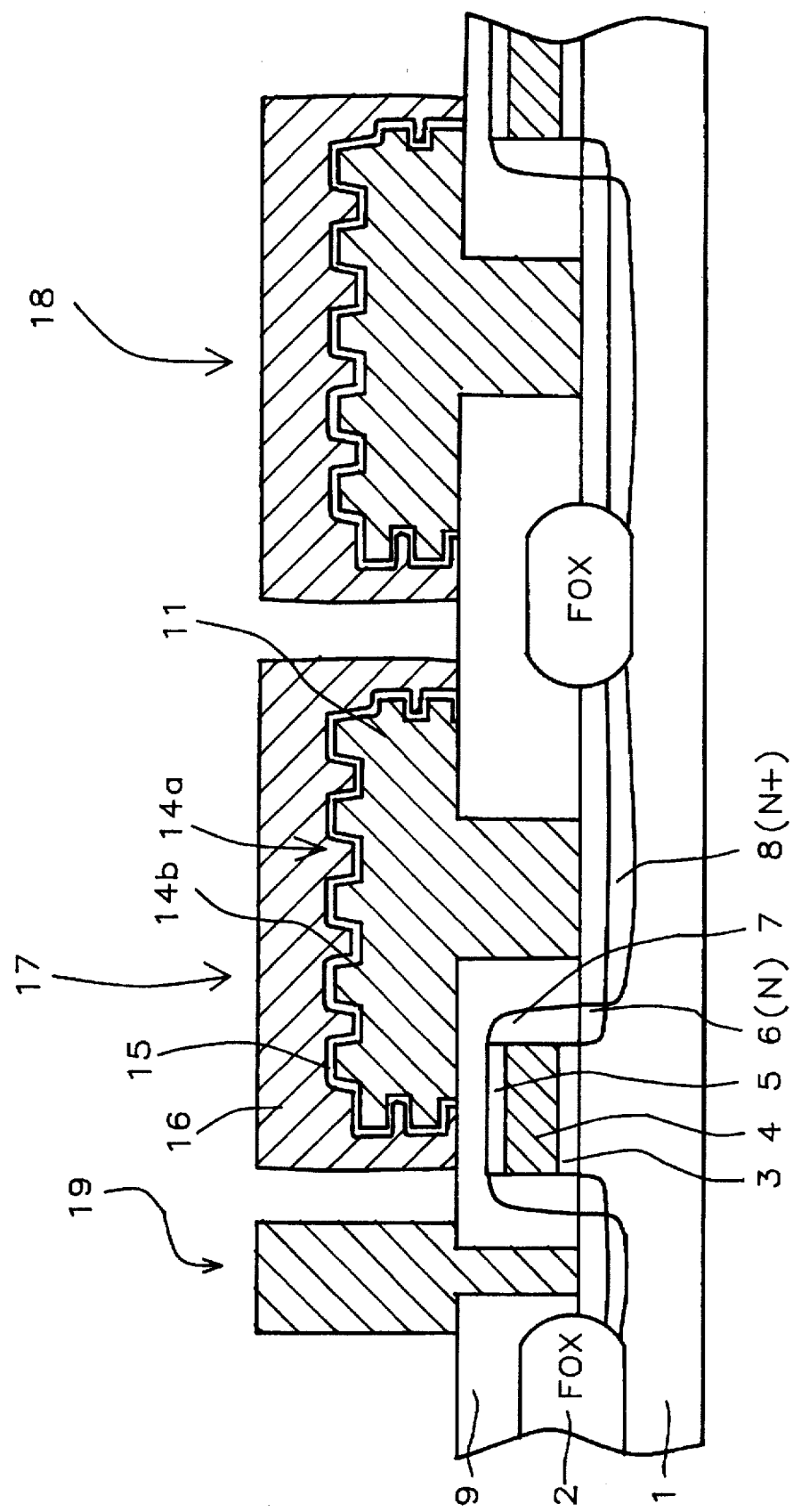

This invention allows an increase in capacitor surface area to be obtained without increasing the width of the STC structure. FIG. 8, schematically shows the STC structure, 17, described in this invention, using a spot polysilicon deposition as a key process feature, used to obtain the desired increased capacitance. Also shown in FIG. 8, are another STC structure, 18, used for an adjacent DRAM cell, as well as a metal contact structure, 19, used to contact the source region of STC structure, 17. The space between STC structures, 17 and 18, is between about 500 to 5000 Angstroms, while the space between STC structure, 17, and metal contact structure, 19, is also between about 500 to 5000 Angstroms. The ability to keep the STC structure narrow, while still increasing surface area, allowed this density to be achieved. Therefore this invention, increasing capacitor surface area without increasing STC size, becomes critical when used for high density DRAM designs, such as 16 Mb or greater.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a DRAM device, on a semiconductor substrate, consisting of a plurality of memory cells, with each said memory cell containing an underlying transistor, with a gate insulator, a gate electrode structure, and a source and drain region, and each said memory cell containing an overlying capacitor structure, with a bottom electrode, a dielectric layer, and an overlying top electrode, with said bottom electrode electrically contacting said drain region, of said transistor, comprising the steps of:

depositing a first insulator layer on said underlying transistor, of said memory cell;

opening a contact hole, in said insulator layer, to expose top surface of said drain region, of said underlying transistor;

depositing a first polysilicon layer on top surface of said first insulator layer, and on top surface of said drain region, exposed in said contact hole;

patterning said first polysilicon layer to form said bottom electrode of said capacitor structure;

depositing a second insulator layer on said bottom electrode, of said capacitor structure;

a deposition of spot polysilicon, on said second insulator layer, to a thickness between about 100 to 300 Angstroms, forming a discontinuous layer of polysilicon mounds, between about 50 to 500 Angstroms, in diameter, with spaces between said polysilicon mounds, between about 100 to 1000 Angstroms;

removal of said second insulator layer, exposed in spaces between said polysilicon mounds, creating a masking structure of polysilicon mounds, overlying second insulator mounds;

formation of crevices in said bottom electrode, created via partial etching of said bottom electrode, in areas not covered by said masking structure, with said crevices between about 500 to 5000 Angstroms, in depth, and with said partial etching procedure completely removing said polysilicon mounds from underlying said second insulator mounds, of said masking structure;

removal of said second insulator mounds from surface of said bottom electrode, exposing polysilicon pillars in areas of said bottom electrode not exposed to crevice formation process;

forming said dielectric layer on said bottom electrode;

depositing a second polysilicon layer on said dielectric layer; and patterning of said second polysilicon layer to form said top electrode, of said capacitor structure.

2. The method of claim 1, wherein said first polysilicon layer is deposited using LPCVD procedures, at a temperature between about 500° to 700° C., to a thickness between about 3000 to 7000 Angstroms.

3. The method of claim 1, wherein said bottom electrode is formed via RIE processing of said first polysilicon layer, using $Cl_2$ as an etchant, with said bottom electrode having a width between about 2000 to 10000 Angstroms.

4. The method of claim 1, wherein said second insulator layer is silicon oxide, thermally grown at a temperature between about 650° to 950° C., to a thickness between about 100 to 300 Angstroms.

5. The method of claim 1, wherein said spot polysilicon deposition is performed using LPCVD procedures, at a temperature between about 500° to 750° C., to a thickness between about 100 to 300 Angstroms, creating said polysilicon mounds with a diameter between about 50 to 500 Angstroms, and with spaces between said polysilicon mounds, between about 100 to 1000 Angstroms.

6. The method of claim 1, wherein said second insulator layer is etched using a dilute hydrofluoric acid solution, comprised of 1 part hydrofluoric acid, to between about 10 to 200 parts water.

7. The method of claim 1, wherein etching of said bottom electrode, used to create said crevices and said polysilicon pillars, is performed via a dry, isotropic etch, using $Cl_2$ as an etchant, with an etch selectivity of polysilicon to silicon oxide of between about 40 and 100, to 1.

8. The method of claim 1, wherein said crevices in said bottom electrode, are between about 500 to 5000 Angstroms, in depth.

9. The method of claim 1, wherein surface area of said bottom electrode is increased between about 50 to 250%, as a result of formation of said crevices and of said polysilicon pillars.

10. The method of claim 1, wherein said dielectric layer is ONO, at an equivalent silicon dioxide thickness between about 40 to 80 Angstroms, created by an initial thermal oxidation to form a silicon oxide layer, between about 10 to 50 Angstroms, followed by a deposition of silicon nitride, to a thickness between about 10 to 20 Angstroms, and thermal oxidation of said silicon nitride layer, creating a silicon oxynitride layer, on the underlying, said silicon oxide layer.

11. The method of claim 1, wherein said dielectric layer is $Ta_2O_5$, obtained using either r.f. sputtering, or CVD techniques, at an effective silicon oxide thickness between about 10 to 60 Angstroms.

12. The method of claim 1, wherein said second polysilicon layer is deposited using LPCVD procedures, at a temperature between about 500° to 700° C., to a thickness between about 1000 to 5000 Angstroms.

13. A method of fabricating a stacked capacitor structure, (STC), overlying a transistor structure, for a DRAM cell, in which the surface area of the storage node electrode, of said STC structure, is increased via formation of polysilicon pillars, and crevices, on the surface of said storage node, comprising the steps of:

depositing a first insulator layer on underlying, said transistor structure, of said DRAM cell;

opening a contact hole in said first insulator layer, to expose a region of said transistor structure;

depositing a first polysilicon layer on said first insulator layer, and on said exposed region of said transistor structure;

patterning of said first polysilicon layer to create said storage node electrode, of said STC structure;

depositing an thin insulator layer on said storage node electrode;

a deposition of spot polysilicon on said thin insulator layer, creating polysilicon mounds between about 100 to 300 Angstroms in thickness, with said polysilicon mounds having a diameter between about 50 to 500 Angstroms, and with spaces between said polysilicon mounds of between about 100 to 1000 Angstroms;

removal of said thin insulator layer, exposed in spaces between said polysilicon mounds, creating a masking structure, comprised of said polysilicon mounds, overlying thin insulator mounds;

etching of first polysilicon layer, in spaces between said masking structure, to create crevices in said storage node electrode, between about 500 to 5000 Angstroms in depth, while said etching of said first polysilicon layer completely removes said polysilicon mounds from said masking structure;

removal of said thin insulator mounds from the surface of said storage node electrode, exposing polysilicon pillars on areas of said storage node electrode, between said crevices;

forming a thin dielectric layer on the surface of said storage node electrode;

depositing a second polysilicon layer on said thin dielectric layer; and and patterning of said second polysilicon layer to create a plate electrode for said STC structure.

14. The method of claim 13, wherein said first polysilicon layer is obtained via LPCVD procedures, at a temperature between about 500° to 700° C., to a thickness between about 3000 to 7000 Angstroms.

15. The method of claim 13, wherein said storage node electrode is formed via RIE processing of said first polysilicon layer, using $Cl_2$ as an etchant, with a width of said storage node electrode, between about 2000 to 10000 Angstroms.

16. The method of claim 13, wherein said thin insulator layer is silicon oxide, thermally grown at a temperature between about 650° to 950° C., or deposited using LPCVD procedures, to a thickness between about 100 to 300 Angstroms.

17. The method of claim 13, wherein said polysilicon mounds are formed via LPCVD deposition of said spot polysilicon, at a temperature between about 500° to 750° C., to a thickness between about 100 to 300 Angstroms, with said polysilicon mound having a diameter between about 50 to 500 Angstroms, and with spaces between said polysilicon mounds, between about 100 to 1000 Angstroms.

18. The method of claim 13, wherein said thin insulator mounds are formed via etching of said thin insulator layer, using said polysilicon mounds as a mask, in a solution comprised of 1 part hydrofluoric acid to between about 10 to 200 parts water.

19. The method of claim 13, wherein said crevices, in said first polysilicon layer, are between about 500 to 5000 Angstroms in depth, formed via a dry, isotropic etch, using $Cl_2$ as an etchant, with a etch selectivity of between about 40 and 100, to 1, between polysilicon and the masking thin insulator mounds, and resulting in an increase in surface area of said storage node electrode of between about 50 to 250%, when compared to electrodes fabricated with smooth surfaces.

20. The method of claim 13, wherein said thin dielectric layer is ONO, with an equivalent silicon oxide thickness between about 40 to 80 Angstroms, created by growing a thin silicon oxide layer on said storage node electrode, at a thickness between about 10 to 50 Angstroms, depositing between about 10 to 20 Angstroms of a silicon nitride layer, and oxidizing said silicon nitride layer to from a silicon oxynitride layer on said thin silicon oxide layer.

21. The method of claim 13, wherein said thin dielectric layer is $Ta_2O_5$, deposited using r.f. sputtering, or CVD procedures, to an effective silicon oxide thickness between about 10 to 60 Angstroms.

22. The method of claim 13, wherein said second polysilicon layer is deposited using LPCVD procedures, at a temperature between about 500° to 700° C., to a thickness between about 1000 to 5000 Angstroms.

23. The method of claim 13, wherein said plate electrode is created via RIE of said second polysilicon layer, using $Cl_2$ as an etchant, with said plate electrode having a width between about 3000 to 15000 Angstroms.

24. The method of claim 13, wherein the space between STC structures, overlying adjacent transfer gate transistor structures, is between about 500 to 5000 Angstroms.

25. The method of claim 13, wherein the space between said STC structure and a metal contact structure to a region of an underlying transfer gate transistor, is between about 500 to 5000 Angstroms.

* * * * *